(12) United States Patent
Negishi et al.

(10) Patent No.: US 10,068,825 B2
(45) Date of Patent: Sep. 4, 2018

(54) SEMICONDUCTOR DEVICE

(71) Applicant: Mitsubishi Electric Corporation, Chiyoda-ku (JP)

(72) Inventors: Tetsu Negishi, Chiyoda-ku (JP); Mamoru Terai, Chiyoda-ku (JP); Kei Yamamoto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/303,987

(22) PCT Filed: Mar. 17, 2015

(86) PCT No.: PCT/JP2015/057853
§ 371 (c)(1),
(2) Date: Oct. 13, 2016

(87) PCT Pub. No.: WO2015/166737
PCT Pub. Date: Nov. 5, 2015

(65) Prior Publication Data
US 2017/0033028 A1    Feb. 2, 2017

(30) Foreign Application Priority Data

Apr. 28, 2014 (JP) .................................. 2014-092702

(51) Int. Cl.
*H01L 29/16* (2006.01)
*H01L 23/31* (2006.01)
(Continued)

(52) U.S. Cl.
CPC .... *H01L 23/3171* (2013.01); *H01L 21/02164* (2013.01); *H01L 21/02271* (2013.01);
(Continued)

(58) Field of Classification Search
CPC ..... H01L 23/29; H01L 23/291; H01L 23/293; H01L 23/3135; H01L 23/3192; H01L 23/373
See application file for complete search history.

(56) References Cited

U.S. PATENT DOCUMENTS

2007/0164321 A1* 7/2007 Sheppard .......... H01L 29/66462
257/256
2008/0283870 A1 11/2008 Sato
(Continued)

FOREIGN PATENT DOCUMENTS

JP   61-063042 A    4/1986
JP   1-261850 A    10/1989
(Continued)

OTHER PUBLICATIONS

International Search Report dated Jun. 2, 2015 in PCT/JP/2015/057853 filed Mar. 17, 2015.
(Continued)

*Primary Examiner* — Cuong Q Nguyen
(74) *Attorney, Agent, or Firm* — Oblon, McClelland, Maier & Neustadt, L.L.P.

(57) ABSTRACT

A semiconductor device includes: a semiconductor element which includes semiconductor substrate, an insulating film formed on a front surface of the semiconductor substrate and having an opening, and an electrode formed in the opening on the front surface of the semiconductor substrate; and a first protective film disposed to cover the semiconductor element. The insulating film has a thickness of not less than $\frac{1}{500}$ of a thickness of the semiconductor substrate and not more than 4 μm. The insulating film has a compressive stress per film thickness of not less than 100 MPa/μm.

10 Claims, 6 Drawing Sheets

(51) Int. Cl.
*H01L 21/02* (2006.01)
*H01L 23/29* (2006.01)
*H01L 23/373* (2006.01)
*H01L 23/00* (2006.01)

(52) U.S. Cl.
CPC ............ *H01L 23/29* (2013.01); *H01L 23/291* (2013.01); *H01L 23/293* (2013.01); *H01L 23/3135* (2013.01); *H01L 23/3192* (2013.01); *H01L 23/373* (2013.01); *H01L 29/1608* (2013.01); *H01L 23/3121* (2013.01); *H01L 23/562* (2013.01); *H01L 2224/73265* (2013.01)

(56) References Cited

U.S. PATENT DOCUMENTS

2013/0119393 A1* 5/2013 Zhu .................. H01L 29/872 257/76
2014/0151652 A1* 6/2014 Im .................. H01L 51/5228 257/40
2014/0209914 A1* 7/2014 Nagasawa ............. H01L 27/124 257/72

FOREIGN PATENT DOCUMENTS

| | | |
|---|---|---|
| JP | 04-137753 A | 5/1992 |
| JP | 05-021653 A | 1/1993 |
| JP | 2007-184315 A | 7/2007 |
| JP | 2009-004743 A | 1/2009 |
| JP | 2012-084835 A | 4/2012 |
| JP | 2014-116333 A | 6/2014 |

OTHER PUBLICATIONS

JP Office Action dated Mar. 15, 2016 in JP Application 2015-560437 (with English Translation).

JP Decision to Grant dated Aug. 9, 2016 in JP Application 2015-560437 (with English Translation).

* cited by examiner (a)

(b)

(c)

(a)

(b)

(a)

(b)

(c)

SEMICONDUCTOR DEVICE

TECHNICAL FIELD

The present invention relates to a semiconductor device, and particularly relates to a semiconductor device including a power semiconductor element to be used for electric power control.

BACKGROUND ART

In a power semiconductor element used at a high voltage exceeding several hundreds of volts (V), an insulating film is formed under the edge of a front-side electrode for electrical insulation between the front-side electrode and a back-side electrode each serving as a main electrode. Further, in the power semiconductor element, an electrode edge insulating protective film made of a resin material is formed to surround the outer periphery of the front-side electrode. On the power semiconductor element, an interconnection electrically connectable to the outside is formed, and thereafter the semiconductor element is sealed with a sealing resin. Accordingly, a semiconductor device is completed.

In such a semiconductor device, heat generated from the semiconductor element in operation causes a thermal stress between components of the semiconductor device, due to a difference in thermal expansion coefficient between materials forming the semiconductor device or due to cure shrinkage of the sealing resin.

As a result of this, a peeling defect may occur for example to the interface between a semiconductor substrate and the insulating film or the interface between the semiconductor substrate and the sealing resin. The peeling defect deteriorates the reliability of the semiconductor device and thus should be suppressed.

In the conventional semiconductor device, the region to be sealed with the sealing resin (epoxy resin for example) is entirely covered with a resin material (polyamide for example) having a uniform film thickness, to enhance the adhesive force between the sealing resin and internal components such as power semiconductor chip.

CITATION LIST

Patent Document

PTD 1: Japanese Patent Laying-Open No. 2007-184315

SUMMARY OF INVENTION

Technical Problem

Although it is possible to enhance the adhesive force between the internal components and the sealing resin in the conventional semiconductor device, it has been difficult to sufficiently suppress occurrence of the peeling defect if a large thermal stress is generated due to a large amount of heat generated from the semiconductor element in operation.

The present invention has been made to solve the above-described problem. A main object of the present invention is to provide a semiconductor device in which occurrence of the peeling defect is suppressed.

Solution to Problem

A semiconductor device according to the present invention includes: a semiconductor element including a semiconductor substrate, an insulating film formed on a front surface of the semiconductor substrate and having an opening, and an electrode formed in the opening on the front surface of the semiconductor substrate; and a first protective film disposed to cover the semiconductor element. The insulating film has a thickness of not less than 1/500 of a thickness of the semiconductor substrate and not more than 4 μm, and the insulating film has a compressive stress per film thickness of not less than 100 MPa/μm.

Advantageous Effects of Invention

In accordance with the present invention, a semiconductor device in which occurrence of the peeling defect is suppressed can be provided.

DESCRIPTION OF EMBODIMENTS

Figure 1:
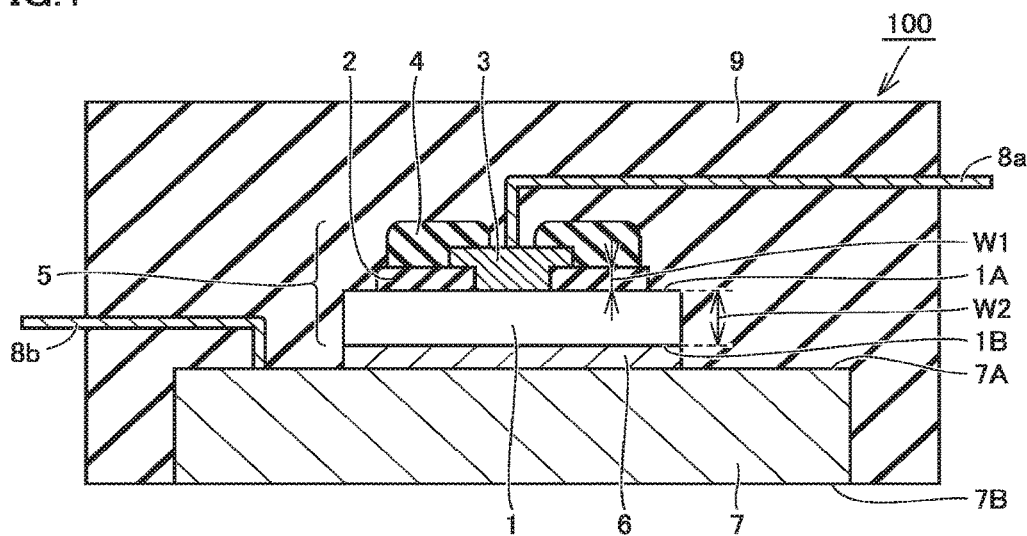
FIG. 1 is a cross-sectional view for illustrating a semiconductor device according to a first embodiment.

Embodiments of the present invention will be described hereinafter with reference to the drawings. In the following drawings, the same or corresponding components are denoted by the same reference numerals, and a description thereof will not be repeated.

First Embodiment

Referring to FIG. 1, a semiconductor device 100 in a first embodiment will be described. Semiconductor device 100 includes: a semiconductor element 5 which has a semiconductor substrate 1, an insulating film 2 formed on a front surface 1A of semiconductor substrate 1 and having an opening, and an electrode 3 formed in the opening on front surface 1A of semiconductor substrate 1; and a first protective film 9 disposed to cover semiconductor element 5.

Semiconductor substrate 1 has front surface 1A and a back surface 1B located opposite to front surface 1A. While thickness W2 of semiconductor substrate 1 corresponding to the distance between front surface 1A and back surface 1B may be set to any thickness, thickness W2 is approximately not less than 100 μm and not more than 700 μm, for example. While the material forming semiconductor substrate 1 may be any semiconductor material, the material forming semiconductor substrate 1 is silicon (Si), silicon carbide (SiC) or the like, for example. Preferably, this material is SiC having high thermal resistance and capable of operation at high temperature. Semiconductor substrate 1 may be warped. For example, semiconductor substrate 1 may be warped in the form of protrusion in the direction of front surface 1A. Insulating film 2 is disposed to be adjacent to electrode 3 and cover a part which is a part of front surface 1A of semiconductor substrate 1 and which is located in the region where electrode 3 is not formed, and also cover the sidewall of electrode 3. In other words, insulating film 2 has an opening and electrode 3 is formed in the opening. In the direction crossing the surface of insulating film 2 abutting on front surface 1A of semiconductor substrate 1, insulating film 2 has an opening edge 21 defining the contour of the opening, and an outer periphery edge 22 located at a side of the outer periphery of semiconductor substrate 1. As seen in plan view of front surface 1A of semiconductor substrate 1, opening edge 21 is formed inside outer periphery edge 22.

Insulating film 2 has a compressive stress. Namely, insulating film 2 is formed of a material and has a thickness which enable the compressive stress to be generated. The material forming insulating film 2 is preferably any material which is electrically insulating and has a compressive stress of not less than 100 MPa/µm, and this material is silicon oxide ($SiO_2$), for example. Thickness W1 of insulating film 2 is not less than 1/500 of thickness W2 of semiconductor substrate 1 and not more than 4 µm. Insulating film 2 is larger in elastic modulus than second protective film 4 and first protective film 9.

Electrode 3 is formed to contact a part which is a part of front surface 1A of semiconductor substrate 1 and which is exposed in the opening of insulating film 2. Electrode 3 may be in ohmic contact or Schottky contact with semiconductor substrate 1. Electrode 3 is formed to extend from inside the opening of insulating film 2 onto insulating film 2. The edge which is the edge of electrode 3 and which is located at a side of the outer periphery of semiconductor substrate 1 is disposed to be located on insulating film 2. The material forming electrode 3 may be any material which is electrically conductive. Electrode 3 may have a multilayer structure made up of films formed of respective conductive materials different from each other.

Semiconductor element 5 may also have an electrode (not shown) on back surface 1B of semiconductor substrate 1. Namely, semiconductor element 5 may be configured to serve as a vertical diode or transistor.

Preferably, semiconductor element 5 further has a second protective film 4. Second protective film 4 is formed on insulating film 2 to have an opening which exposes electrode 3. In the direction crossing the surface of insulating film 2 abutting on front surface 1A of semiconductor substrate 1, second protective film 4 has an opening edge 41 defining the contour of the opening, and an outer periphery edge 42 located at a side of the outer periphery of semiconductor substrate 1.

As seen in plan view of front surface 1A of semiconductor substrate 1, opening edge 41 is formed inside outer periphery edge 42. Opening edge 41 is formed on electrode 3, and outer periphery edge 42 is formed on insulating film 2 or front surface 1A. Namely, second protective film 4 is disposed to cover a part of the outer periphery region of electrode 3. Accordingly, the edge of electrode 3 is covered with insulating film 2 and second protective film 4. While the material forming second protective film 4 may be any material which is electrically insulating and has a smaller elastic modulus than that of the material forming insulating film 2, the material forming second protective film 4 is polyimide, for example. While the thickness of second protective film 4 may be any thickness larger than the part which is a part of electrode 3 and which is formed on insulating film 2, the thickness of second protective film 4 is not less than 6 µm and not more than 50 µm, for example.

Regarding semiconductor element 5, back surface 1B of semiconductor substrate 1 is connected and fixed to an upper surface 7A of a thermal diffusion substrate 7 through solder 6. While the material forming solder 6 may be any solder material, the material forming solder 6 is aluminum (Al), for example. While the material forming thermal diffusion substrate 7 may be any material having a high thermal conductivity, the material forming thermal diffusion substrate 7 may for example be an electrically conductive material such as copper (Cu), Al or a composite material of them, or an electrically insulating material like a high-K material such as $SiO_2$, SiN, $Al_2O_3$, AlN or a composite material of them.

An interconnection 8a is formed to extend from electrode 3 exposed in the opening of second protective film 4, to the outside of first protective film 9. Moreover, an interconnection 8b is formed to extend from upper surface 7A of thermal diffusion substrate 7 to the outside of first protective film 9. Interconnections 8a, 8b can electrically connect the outside of semiconductor device 100 and semiconductor element 5. Interconnections 8a, 8b may be formed of a leadframe or formed of a bonding wire.

First protective film 9 is formed to cover semiconductor element 5 and thermal diffusion substrate 7, except for a lower surface 7B of thermal diffusion substrate 7 and a part of interconnections 8a, 8b.

A method of manufacturing semiconductor device 100 in the first embodiment will now be described. The method of manufacturing semiconductor device 100 includes the steps of forming semiconductor element 5 using semiconductor substrate 1, and sealing semiconductor element 5 with first protective film 9.

In the step of forming semiconductor element 5, semiconductor substrate 1 is initially prepared, and a transistor or diode is formed on semiconductor substrate 1. At this time, semiconductor element 5 may be formed as a vertical transistor or a vertical diode and, on front surface 1A of semiconductor substrate 1, insulating film 2 having an opening in the region where an electrode is to be formed, and electrode 3 configured to serve as an ohmic electrode or a Schottky electrode are formed. As semiconductor substrate 1, an SiC substrate having a thickness W2 for example of 370 µm is prepared.

Next, on front surface 1A of semiconductor substrate 1, insulating film 2 is formed. Insulating film 2 is formed to have a compressive stress per film thickness of not less than 100 MPa/µm and have a thickness W1 which is not less than 1/500 of thickness W2 of semiconductor substrate 1 and not more than 4 µm. Insulating film 2 is formed as a silicon oxide ($SiO_2$) film having a thickness of not less than 1.2 µm, by the LP-CVD (Low Pressure Chemical Vapor Deposition) method using TEOS (tetraethoxysilane) as a raw material, for example. It should be noted that it is difficult for other methods such as gas-source plasma CVD and sputtering to form insulating film 2 having a compressive stress per film thickness of not less than 100 MPa/µm.

Next, insulating film 2 is patterned. Insulating film 2 is patterned by means of a mask pattern which is formed on insulating film 2 by any method, through anisotropic etching performed on insulating film 2, for example. The anisotropic etching is performed based on reactive ion etching (RIE), for example. Accordingly, on front surface 1A of semiconductor substrate 1, insulating film 2 is removed from the region where electrode 3 is to be formed and the region overlapping a dicing area located away from the region for electrode 3, and thus a corresponding part of front surface 1A of semiconductor substrate 1 is exposed. The patterning may be performed through isotropic etching or a combination of anisotropic etching and isotropic etching. The isotropic etching is performed based on chemical wet etching using hydrogen fluoride (HF), for example.

Next, electrode 3 is formed on front surface 1A of semiconductor substrate 1. While the method of forming electrode 3 may be any film deposition method, this method may be a physical vapor deposition method such as vapor deposition method or sputtering method, or a chemical vapor deposition method such as plating method. Electrode 3 is formed to have a thickness larger than thickness W1 of insulating film 2. Electrode 3 is patterned by means of a mask pattern through anisotropic etching performed on electrode 3, or patterned by the lift-off method, for example. Electrode 3 is patterned so that the edge of electrode 3 is located on insulating film 2.

Next, second protective film 4 is formed. Second protective film 4 is formed as a polyimide film having a thickness of not less than 6 µm and not more than 50 µm, using the spin-coat method, for example. Further, second protective film 4 is patterned by any method. For example, second protective film 4 is patterned through RIE in a similar manner to the manner in which insulating film 2 is patterned.

In this way, a plurality of semiconductor elements 5 configured to serve as predetermined transistors and/or diodes are formed on semiconductor substrate 1. After this, semiconductor substrate 1 is diced into individual semiconductor elements 5.

Next, individual semiconductor element 5 is connected and fixed to thermal diffusion substrate 7 through solder 6. Next, interconnection 8a is connected to electrode 3 of semiconductor element 5. Further, interconnection 8b is connected to upper surface 7A of thermal diffusion substrate 7 which is electrically connected to back surface 1B of semiconductor element 5 through solder 6.

Next, first protective film 9 is formed. Specifically, semiconductor element 5 and thermal diffusion substrate 7 are components to be sealed, and the components to be sealed are sealed with first protective film 9. First protective film 9 is formed by the transfer mold method. Specifically, the components to be sealed are placed inside a mold, and a flowable material (thermosetting resin) which is to form first protective film 9 is supplied into the mold and cured through heating. In this way, semiconductor device 100 in the first embodiment can be obtained.

Figure 2:
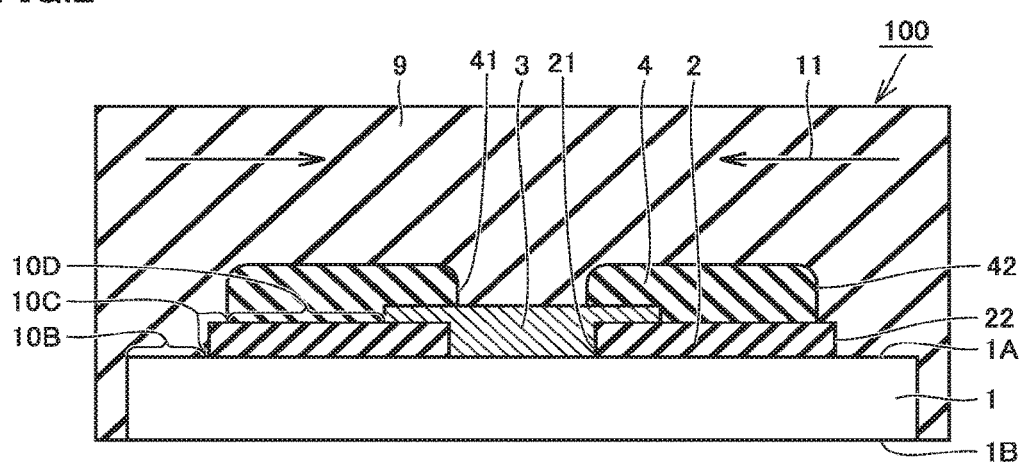
FIG. 2 is a cross-sectional view for illustrating the semiconductor device according to the first embodiment.

Next, functions and effects of semiconductor device 100 in the first embodiment will be described. First, referring to FIG. 2, a thermal stress applied to semiconductor device 100 will be described. In semiconductor device 100, heat is generated from semiconductor element 5 in operation to cause a thermal stress applied in the directions indicated by arrows 11. The thermal stress is caused by a difference in thermal expansion coefficient between components of semiconductor device 100, or cure shrinkage of first protective film 9. The thermal stress occurs similarly to the conventional semiconductor device with a semiconductor element sealed with resin.

In this semiconductor substrate 100, there are an interface 10B between semiconductor substrate 1 and first protective film 9, an interface 10C between insulating film 2 and first protective film 9, and an interface 10D between insulating film 2 and second protective film 4. Therefore, the thermal stress generated in semiconductor device 100 may cause peeling defects at these interfaces. Actually, it has been confirmed, as a result of a study conducted by the inventors of the present application, peeling defects occur to interfaces 10B, 10C, 10D in a semiconductor device configured similarly to semiconductor device 100 and having insulating film 2 with a thickness W1 of less than 1/500 of thickness W2 of semiconductor substrate 1.

Figure 3:
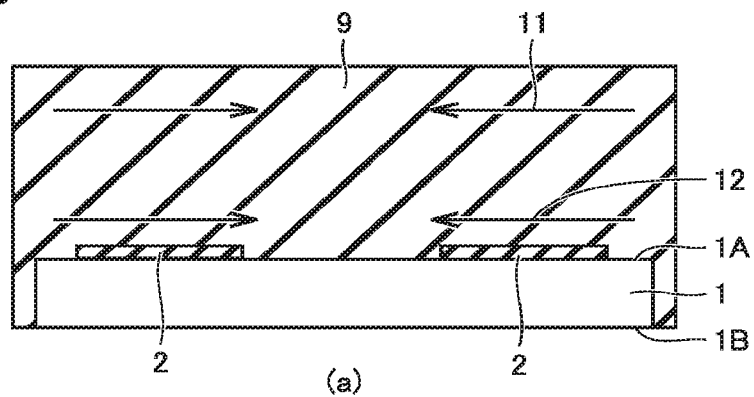
FIG. 3 is a cross-sectional view for illustrating a thermal stress generated in the semiconductor device according to the first embodiment.
Figure 3:
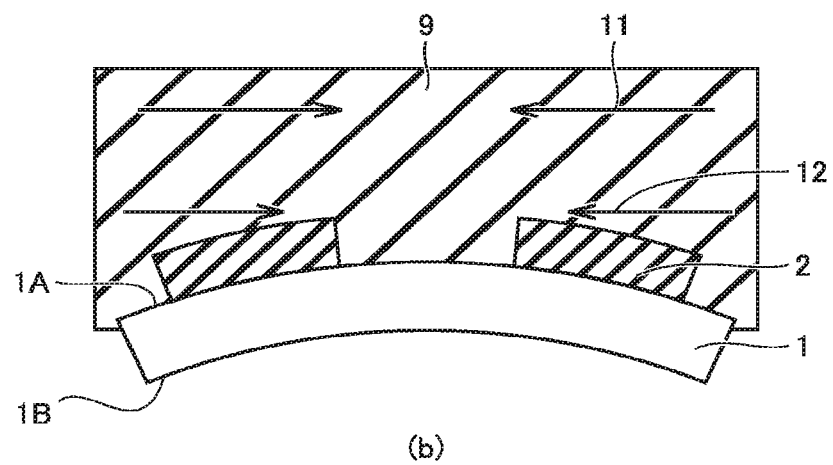
Figure 3:
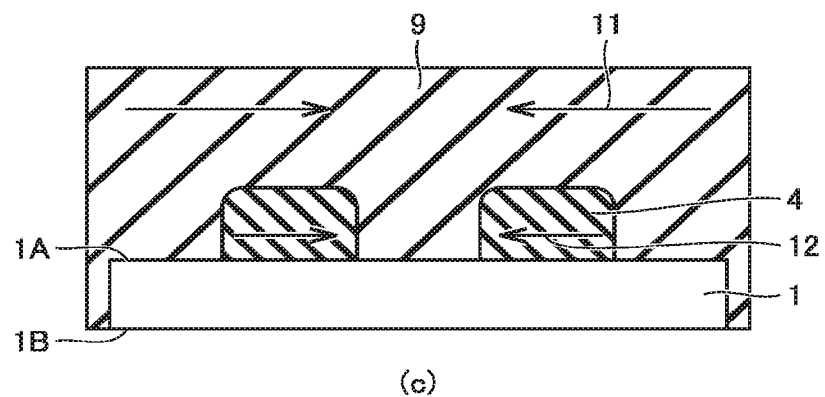

FIG. 3(a) is a cross-sectional view for illustrating a thermal stress generated in semiconductor device 100 when thickness W1 of insulating film 2 is less than 1/500 of thickness W2 of semiconductor substrate 1, and other components are not shown. FIG. 3(b) is a cross-sectional view for illustrating a thermal stress generated in semiconductor device 100 when thickness W1 of insulating film 2 is not less than 1/500 of thickness W2 of semiconductor substrate 1, and other components are not shown. FIG. 3(c) is a cross-sectional view for illustrating a thermal stress generated in semiconductor device 100 having second protective film 4, and other components are not shown. In each drawing in FIG. 3, the length of each of arrows 11 and 12 represents the magnitude of the thermal stress in the corresponding region. The longer the length of the arrow, the greater the thermal stress.

Referring to FIG. 3 (a), a part of the thermal stress applied in the vicinity of front surface 1A of semiconductor substrate 1 acts in the direction of arrow 12 along front surface 1A. This is a thermal stress caused by a difference in thermal expansion coefficient between semiconductor substrate 1 and first protective film 9 or a difference in thermal expansion coefficient between insulating film 2 and first protective film 9, and is a factor which may cause a peeling defect at interface 10B between semiconductor substrate 1 and first protective film 9. When thickness W1 of insulating film 2 is less than 1/500 of thickness W2 of semiconductor substrate 1, for example, the thermal stress applied in the vicinity of front surface 1A of semiconductor substrate 1 has a similar magnitude to the magnitude of a thermal stress at a position located upward away from front surface 1A. Therefore, when the thermal stress in the vicinity of front surface 1A is stronger than the adhesive force between front surface 1A of semiconductor substrate 1 and first protective film 9, namely the adhesive force at interface 10B, a peeling defect will occur to interface 10B.

A similar peeling defect was confirmed as long as thickness W1 of insulating film 2 was less than 1/500 of thickness W2 of semiconductor substrate 1, even when the compressive stress per thickness of insulating film 2 was not less than 100 MPa/µm. This peeling defect is considered as being caused as follows. Namely, when thickness W1 of insulating film 2 is thin, the compressive stress generated in insulating film 2 is small. Therefore, semiconductor substrate 1 cannot be sufficiently warped in the form of protrusion in the direction of front surface 1A, and thus the thermal stress applied in the direction of arrow 12 in the vicinity of front surface 1A of semiconductor substrate 1 cannot be made sufficiently smaller than the aforementioned adhesive force.

In contrast, referring to FIG. 3(b), since semiconductor device 100 in the first embodiment has insulating film 2 with thickness W1 which is not less than 1/500 of thickness W2 of semiconductor substrate 1, the compressive stress generated in insulating film 2 can be made sufficiently large and thus semiconductor substrate 1 can be sufficiently warped in the form of protrusion in the direction of front surface 1A. At this time, the thermal stress generated in the direction of arrow 12 is a force pressing front surface 1A (interface 10B) of semiconductor substrate 1. As a result of this, although the thermal stress in the direction of arrow 12 contributes to occurrence of the peeling defect when semiconductor substrate 1 cannot be sufficiently warped in the form of protrusion in the direction of front surface 1A, this thermal stress can be generated to act as a force which makes the peeling defect less likely to occur between semiconductor substrate 1 and first protective film 9 or between insulating film 2 and first protective film 9. Moreover, the force (thermal stress) in the direction along front surface 1A (interface 10B) that causes the peeling defect between semiconductor substrate 1 and first protective film 9 or between insulating film 2 and first protective film 9 can be made sufficiently smaller than the adhesive force between front surface 1A of semiconductor substrate 1 and first protective film 9, namely the adhesive force at front surface 1A (interface 10B).

Moreover, a force in the direction perpendicular to front surface 1A (interface 10B) also acts on front surface 1A. This force is a force in the direction along the surface which is included in interface 10C and which extends perpendicularly to front surface 1A of semiconductor substrate 1. Through the function similar to the function of sufficiently reducing the force in the direction along front surface 1A (interface 10B) as described above, the force perpendicular to front surface 1A (interface 10B) can be made sufficiently smaller than the adhesive force between insulating film 2 and first protective film 9. Actually, the inventors of the present application have confirmed that the peeling defect at interfaces 10B, 10C, 10D can be suppressed in semiconductor device 100 of the first embodiment. Details will be described later herein.

Further, referring to FIG. 3(c), semiconductor device 100 in the first embodiment includes second protective film 4 having a smaller elastic modulus than first protective film 9. Therefore, second protective film 4 can act as a stress relief layer when a thermal stress is applied, and thus the thermal stress in the direction of arrow 12 in the vicinity of front surface 1A of semiconductor substrate 1 can be relieved. As a result of this, by second protective film 4 disposed as a layer overlying insulating film 2, it is possible to relieve the thermal stress itself which is generated in the direction of arrow 12. Further, as shown in FIG. 3(b), insulating film 2 can be disposed so that the force (thermal stress) in the direction along interface 10B is a component of the thermal stress to be relieved by second protective film 4. Consequently, occurrence of the peeling defect at interface 10B can be suppressed in semiconductor device 100.

Figure 4:
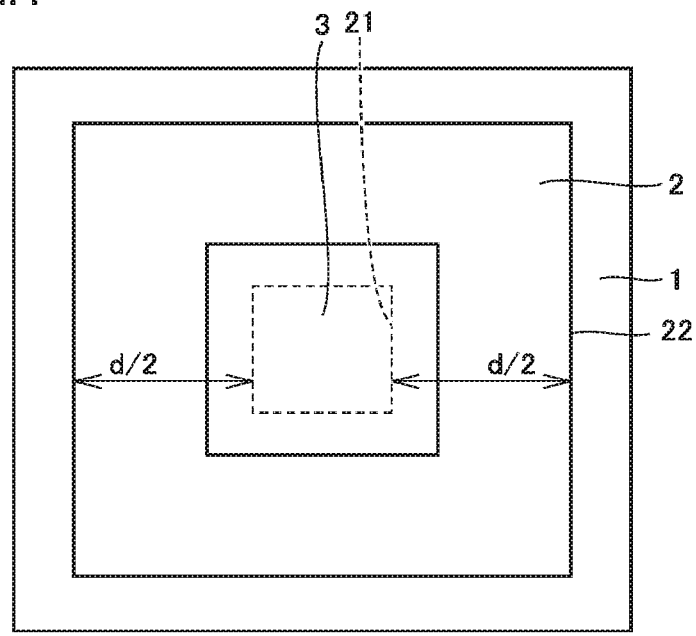
FIG. 4 is a top view for illustrating an insulating film of the semiconductor device according to the first embodiment.

FIG. 4 is a top view for illustrating insulating film 2 of semiconductor device 100. Referring to FIG. 4, preferably the region where insulating film 2 contacts front surface 1A of semiconductor substrate 1 is larger. In other words, preferably insulating film 2 has a longer distance between opening edge 21 and outer periphery edge 22 in the direction from the outside to the inside of semiconductor substrate 1 (the direction in which cure shrinkage of first protective film 9 occurs). For example, when the shape of semiconductor substrate 1 as seen in plan view is a square shape and electrode 3 is formed at the center of this square shape, preferably a length d which is twice the distance d/2 between opening edge 21 and outer periphery edge 22 in the direction along one side of semiconductor substrate 1 is longer, since a longer length d means that the area where semiconductor substrate 1 abuts on insulating film 2 is larger. As such, in a wider range, insulating film 2 abuts on semiconductor substrate 1 and therefore, the compressive stress of insulating film 2 can act on a wider range. Therefore, semiconductor substrate 1 can be significantly warped in the form of protrusion in the direction of back surface 1B when semiconductor substrate 1 is caused to thermally expand due to a difference in thermal expansion coefficient between components of semiconductor device 100. As a result of this, the thermal stress applied in the direction along interface 10B where front surface 1A of semiconductor substrate 1 contacts first protective film 9 can be reduced more effectively.

Preferably, the width of the portion where insulating film 2 contacts semiconductor substrate 1, in the direction of the length of one side of semiconductor substrate 1, namely length d which is twice the distance d/2 between opening edge 21 and outer periphery edge 22, is not less than $\frac{1}{25}$ and not more than $\frac{99}{100}$ of the length of one side of semiconductor substrate 1. When length d is not less than $\frac{1}{25}$ of the length of one side of semiconductor substrate 1, the force (thermal stress) in the direction along interface 10B can be made smaller, by the insulating film 2, than the adhesive force between front surface 1A of semiconductor substrate 1 and first protective film 9, namely the adhesive force at interface 10B, as described above. Moreover, on semiconductor substrate 1 on a wafer before dicing of semiconductor substrate 1, preferably insulating film 2 is not formed in a dicing area, for example. In this way, shortening of the lifetime of a dicing blade can be suppressed and the dicing quality can be stabilized. Moreover, in the dicing area, it is preferable not to form electrode 3 and second protective film 4 in addition to insulating film 2. In order not to form insulating film 2 in the dicing area, insulating film 2 formed in the dicing area may be removed by etching, or a lift-off pattern may be formed in the dicing area to remove insulating film 2 by the lift-off method, for example. In this case, aforementioned length d is not more than $\frac{99}{100}$ of the length of one side of semiconductor substrate 1. Accordingly, shortening of the lifetime of a dicing blade can be suppressed and the dicing quality can be stabilized.

It should be noted that since the thermal stress in the direction along interface 10B is made small, the thermal stress in the direction along interface 10D which is formed substantially in parallel with interface 10B and the thermal stress in the direction along interface 10C including a surface extending perpendicularly to interface 10B are made small. Moreover, a peeling defect at interface 10B can be prevented from causing peeling at interface 10C or interface 10D. Therefore, occurrence of the peeling defect at interface 10C and interface 10D can also be suppressed.

Figure 5:
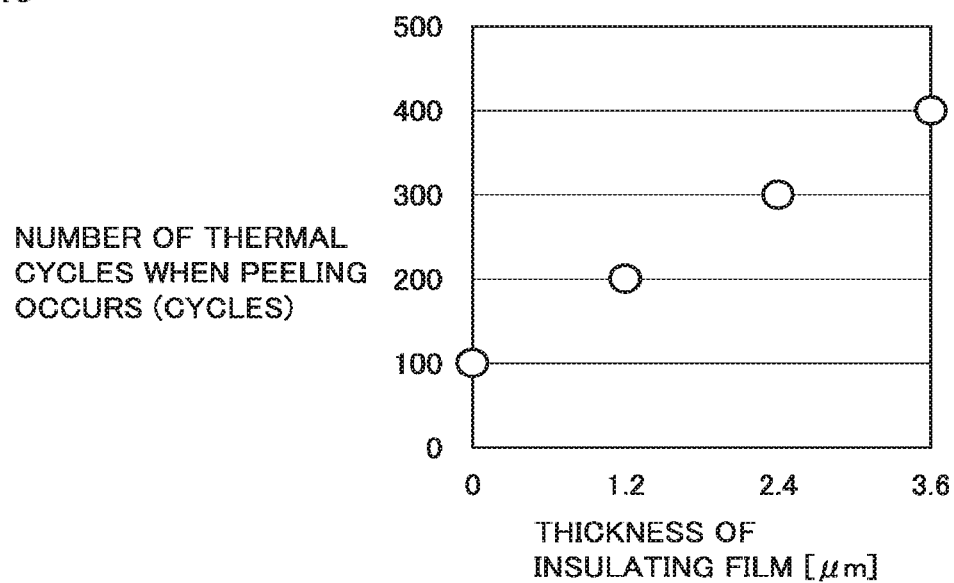
FIG. 5 is a graph showing the results of a thermal cycle test for the semiconductor device according to the first embodiment.

Referring to FIG. 5, the inventors of the present application conducted a thermal cycle test for semiconductor device 100 in the first embodiment over a temperature range to be reached due to heating in operation, and confirmed that the peeling defect could be suppressed sufficiently. Moreover, in order to confirm the peeling-defect suppressing effect produced by insulating film 2 disposed in semiconductor device 100, a thermal cycle test was conducted for a sample prepared to conform to semiconductor device 100 in the first embodiment. Specifically, in the prepared sample, an SiC substrate was used as semiconductor substrate 1, an $SiO_2$ film formed by the LP-CVD method was used as insulating film 2, and epoxy resin was used for first protective film 9, while electrode 3 and second protective film 4 were not formed.

Referring to FIG. 5, as a result of the thermal cycle test for the sample, the number of thermal cycles when the peeling defect occurs increases as the thickness of insulating film 2 increases. Namely, it was confirmed that increase of the thickness of insulating film 2 improved the peeling resistance.

In the case where insulating film 2 was not formed, namely insulating film 2 had a thickness of 0 μm, the peeling defect was confirmed when the number of thermal cycles reached a target number of thermal cycles (100 cycles). In contrast, in the case where the thickness of insulating film 2 was not less than 1.2 µm, namely not less than 1/500 of the thickness 600 µm of semiconductor substrate 1 like the one in semiconductor device 100 of the first embodiment, the peeling defect was not confirmed when the number of thermal cycles reached the target number of thermal cycles (100 cycles). In this case, peeling was confirmed for the first time when the number of thermal cycles reached 200. These results indicate that the peeling resistance increases as the thickness of insulating film 2 increases, and semiconductor device 100 in which the thickness of insulating film 2 is not less than 1/500 of the thickness of semiconductor substrate 1 can have sufficient peeling resistance.

The inventors of the present application also confirmed that a physical breakage such as peeling of insulating film 2 from semiconductor substrate 1 occurred when thickness W1 of insulating film 2 was larger than 4 µm. Desired electrical insulation cannot be ensured when the physical breakage of insulating film 2 occurs. The inventors thus confirmed that a preferred thickness of insulating film 2 that would not result in the physical breakage was not more than 4 µm.

Second protective film 4 in semiconductor device 100 of the first embodiment may act as a stress relief layer as described above. Since the outer periphery edge of electrode 3 is covered with second protective film 4 and insulating film 2, electrical insulation of semiconductor device 100 can be improved. Further, the inventors of the present application confirmed the tendency that peeling was less likely to proceed along interface 10D between insulating film 2 and second protective film 4, as compared with peeling at interface 10B between front surface 1A of semiconductor substrate 1 and first protective film 9. In view of this, it is seen that second protective film 4 can be formed on insulating film 2 as described above to suppress occurrence of the peeling defect more effectively.

Figure 6:
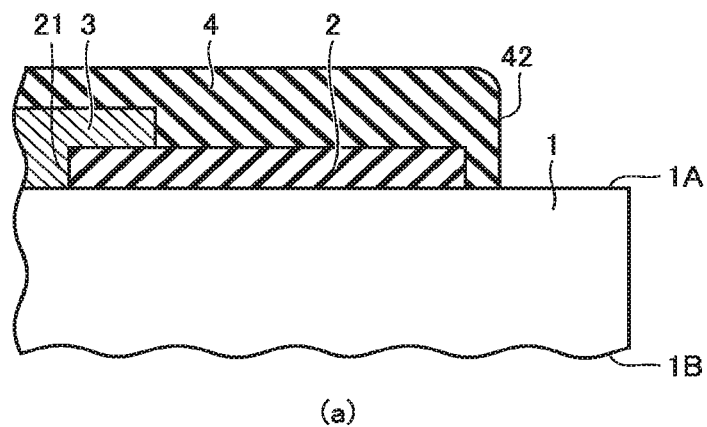
FIG. 6 is a cross-sectional view for illustrating modifications of the insulating film and a second protective film of the semiconductor device according to the first embodiment.
Figure 6:
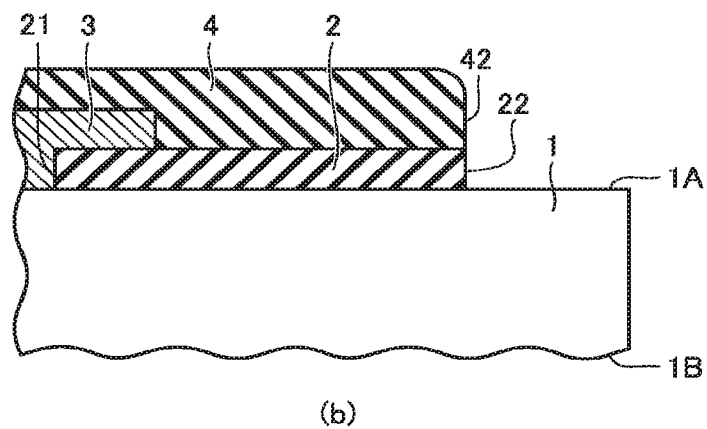

In semiconductor device 100 of the first embodiment, interface 10C between insulating film 2 and first protective film 9 is formed. Semiconductor device 100, however, is not limited to this. Referring to FIG. 6(a), preferably outer periphery edge 22 of insulating film 2 is covered with second protective film 4, for example. In this case, interface 10C is not formed in semiconductor device 100, while interface 10B and interface 10D are formed. In such semiconductor device 100, second protective film 4 is formed in a wider region, and therefore, the thermal stress applied in the vicinity of front surface 1A of semiconductor substrate 1 can be relieved in a wider region and occurrence of the peeling defect at interface 10B and interface 10D can be suppressed more effectively.

Referring to FIG. 6(b), outer periphery edge 42 of second protective film 4 may be disposed to overlap outer periphery edge 22 of insulating film 2. In this manner as well, similar effects to those of semiconductor device 100 in the first embodiment can be produced.

Figure 7:
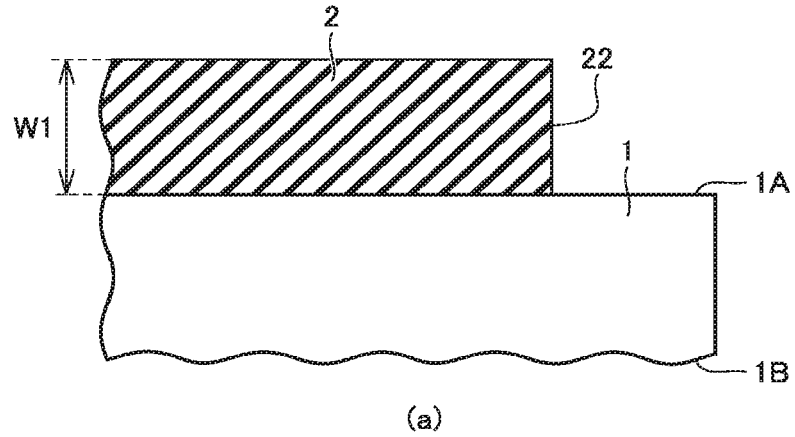
FIG. 7 is a cross-sectional view for illustrating modifications of the insulating film of the semiconductor device according to the first embodiment.
Figure 7:
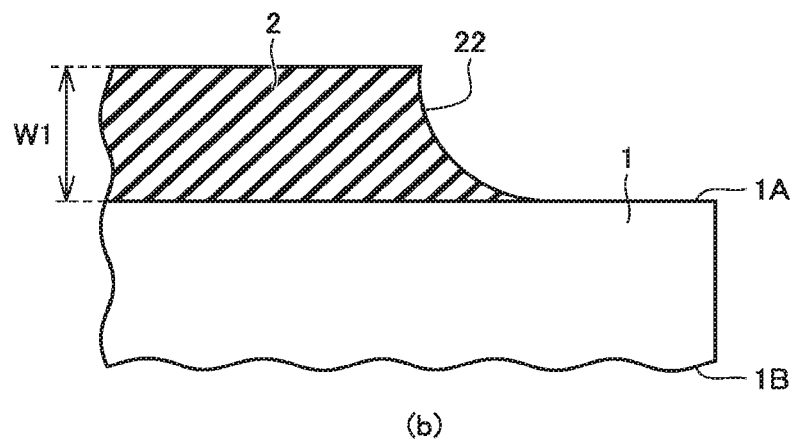
Figure 7:
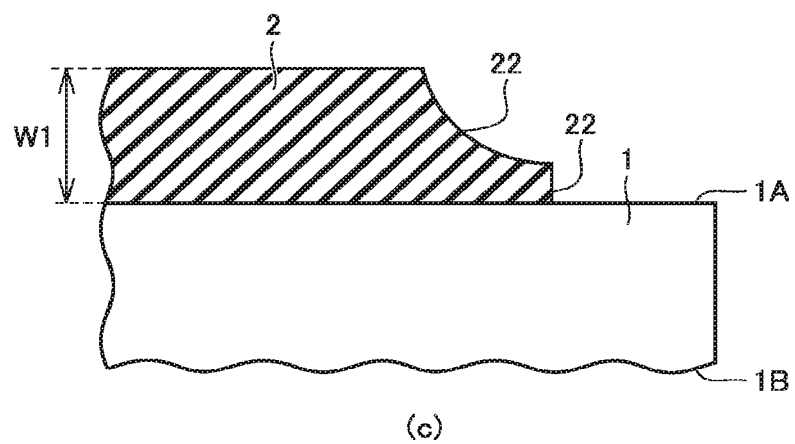

Referring to FIG. 7, any shape of outer periphery edge 22 of insulating film 2 may be selected. As shown in FIG. 7(a), outer periphery edge 22 of insulating film 2 may be an edge face extending perpendicularly to front surface 1A of semiconductor substrate 1, for example. Alternatively, outer periphery edge 22 of insulating film 2 may have an edge face extending at an acute angle to front surface 1A of semiconductor substrate 1, for example. Moreover, as shown in FIG. 7(b), outer periphery edge 22 of insulating film 2 may have an edge face extending at an angle varying from 0 to 90 degrees to front surface 1A of semiconductor substrate 1, for example. In other words, outer periphery edge 22 of insulating film 2 may be formed in an arc shape in the direction perpendicular to front surface 1A of semiconductor substrate 1. Further, as shown in FIG. 7(c), outer periphery edge 22 shown in FIG. 7(a) may be combined with outer periphery edge 22 shown in FIG. 7(b) in the direction perpendicular to front surface 1A of semiconductor substrate 1. For example, outer periphery edge 22 of insulating film 2 may have an edge face abutting on front surface 1A and extending at an angle of substantially 90 degrees to front surface 1A of semiconductor substrate 1, and an edge face extending at an angle varying from 0 to 90 degrees to front surface 1A of semiconductor substrate 1.

In any of the above-described cases, the thermal stress applied in the direction along interface 10B, interface 10C, and interface 10D can be reduced when interface 10C between outer periphery edge 22 and first protective film 9 is formed, and accordingly occurrence of the peeling defect at interfaces 10B, 10C, 10D can be suppressed. When outer periphery edge 22 is covered with second protective film 4, the thermal stress applied in the direction along interface 10B and interface 10D can be reduced, and accordingly occurrence of the peeling defect at interfaces 10B, 10D can be suppressed.

Preferably, an outer periphery front surface region on front surface 1A of semiconductor substrate 1 abuts on first protective film 9. The outer periphery front surface region is a region including the outer periphery edge of the semiconductor substrate. The outer periphery front surface region herein refers to a region on front surface 1A of semiconductor substrate 1, specifically a region located outside the region where insulating film 2 is formed. On the outer periphery front surface region, insulating film 2 and second protective film 4 are not formed, and the outer periphery front surface abuts on first protective film 9 and forms interface 10B with first protective film 9. Preferably, in semiconductor substrate 1 in the form of wafer before dicing of semiconductor substrate 1, insulating film 2 is not formed in the dicing area. In this way, shortening of the lifetime of a dicing blade can be suppressed and the dicing quality can be stabilized. In this manner as well, semiconductor device 100 in which occurrence of the peeling defect at interface 10B is suppressed can be implemented.

Second Embodiment

Figure 8:
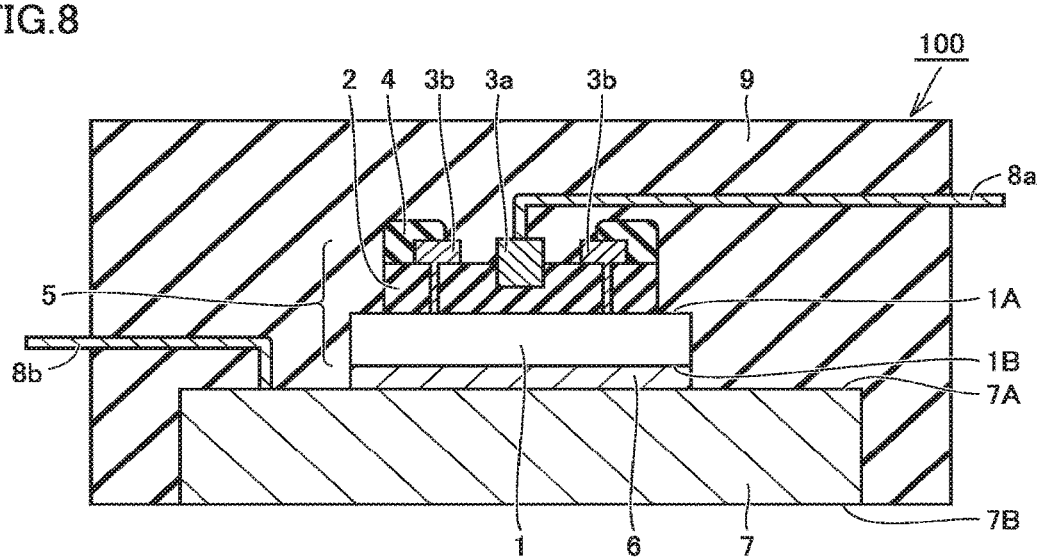
FIG. 8 is a cross-sectional view for illustrating a semiconductor device according to a second embodiment.

Next, referring to FIG. 8, a semiconductor device 100 in a second embodiment will be described. While semiconductor device 100 in the second embodiment is basically configured similarly to semiconductor device 100 in the first embodiment, the former semiconductor device differs from the latter semiconductor device in that the region where electrode 3 is joined to front surface 1A of semiconductor substrate 1 is smaller and the region where insulating film 2 abuts on front surface 1A is larger in the former semiconductor device.

Semiconductor device 100 may be MOSFET (Metal Oxide Semiconductor Field Effect Transistor), for example. Specifically, insulating film 2 may be disposed to serve as a gate oxide film, an electrode 3a may be disposed to serve as a gate electrode, and an electrode 3b may be disposed to serve as a source electrode. Electrode 3a is formed on insulating film 2 and located in a region overlapping a channel region disposed in semiconductor substrate 1. Electrode 3a may be formed so that a part of electrode 3a is embedded in insulating film 2, for example. Electrode 3b is formed on insulating film 2 and located in a region overlapping a source region disposed in semiconductor substrate 1, and is also formed in a through hole formed in insulating film 2 to be electrically connected to the source region.

In this manner as well, similar effects to those of semiconductor device 100 in the first embodiment can be produced. Further, insulating film 2 is a thick film and therefore has a large compressive stress, and insulating film 2 is larger in elastic modulus than second protective film 4 and first protective film 9. In addition, second protective film 4 functions as a stress relief layer. Accordingly, breakage of electrode 3b in the through hole in insulating film 2 due to the thermal stress can be suppressed.

While the embodiments of the present invention have been described above, the above-described embodiments may be modified in various ways. Moreover, the scope of the present invention is not limited to the above-described embodiments. It is intended that the scope of the present invention is defined by claims, and encompasses all modifications and variations equivalent in meaning and scope to the claims.

INDUSTRIAL APPLICABILITY

The present invention is applied particularly advantageously to a semiconductor device operating at high temperature.

REFERENCE SIGNS LIST 1 semiconductor substrate; 1A front surface; 1B back surface; 2 insulating film; 3, 3a, 3b electrode; 4 second protective film; 5 semiconductor element; 6 solder; 7 thermal diffusion substrate; 7A upper surface; 7B lower surface; 8a, 8b interconnection; 9 first protective film; 10B, 10C, 10D interface; 21, 41 opening edge; 22, 42 outer periphery edge; 100 semiconductor device

The invention claimed is:

1. A semiconductor device comprising:
a semiconductor element including
a semiconductor substrate,
an insulating film formed on a front surface of the semiconductor substrate and having an opening, and
an electrode formed in the opening on the front surface of the semiconductor substrate;
a first protective film disposed to cover the semiconductor element; and
a second protective film contacting at least a part of the electrode and at least a part of the insulating film and having an opening exposing the electrode on the insulating film,
an elastic modulus of the insulating film being larger than respective elastic modulus of the first protective film and the second protective film,
the insulating film having a thickness of not less than $1/500$ of a thickness of the semiconductor substrate and not more than 4 µm, and
the insulating film having a compressive stress per film thickness of not less than 100 MPa/µm.

2. The semiconductor device according to claim 1, wherein
the elastic modulus of the second protective film is smaller than the elastic modulus of the first protective film.

3. The semiconductor device according to claim 1, wherein an edge of the insulating film is covered with the second protective film, the edge being located at a side of an outer periphery of the semiconductor substrate.

4. The semiconductor device according to claim 1, wherein a material forming the second protective film is polyimide.

5. The semiconductor device according to claim 1, wherein a material forming the insulating film is silicon oxide.

6. The semiconductor device according to claim 1, wherein the insulating film is formed by a chemical vapor deposition method using a liquid material.

7. The semiconductor device according to claim 1, wherein the semiconductor element is a transistor or a diode.

8. The semiconductor device according to claim 1, wherein a material forming the semiconductor substrate is silicon carbide.

9. The semiconductor device according to claim 1, wherein an outer periphery front surface region on the front surface of the semiconductor substrate abuts on the first protective film, the outer periphery front surface region being a region including an outer periphery edge of the semiconductor substrate.

10. The semiconductor device according to claim 1, wherein
the semiconductor substrate has a square shape as seen in plan view, and
a width of a contact portion where the insulating film is in contact with the semiconductor substrate, in a direction of a length of one side of the semiconductor substrate, is not less than $1/25$ and not more than $99/100$ of the length of one side.

* * * * *